(12) United States Patent
Kim et al.

(10) Patent No.: US 7,120,056 B2
(45) Date of Patent: Oct. 10, 2006

(54) SEMICONDUCTOR MEMORY DEVICE CAPABLE OF BEING MOUNTED ON A SINGLE PACKAGE REGARDLESS OF BIT ORGANIZATION

(75) Inventors: Soon-Young Kim, Gyeonggi-do (KR); June Lee, Seoul (KR); Oh-Suk Kwon, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 95 days.

(21) Appl. No.: 10/848,694

(22) Filed: May 18, 2004

(65) Prior Publication Data

US 2004/0233721 A1 Nov. 25, 2004

(30) Foreign Application Priority Data

May 21, 2003 (KR) .................. 10-2003-0032347

(51) Int. Cl.
*G11C 16/04* (2006.01)
(52) U.S. Cl. .................. 365/185.17; 365/185.05; 365/189.05
(58) Field of Classification Search .......... 365/185.17, 365/185.05, 185.09, 185.33, 189.04, 189.05, 365/230.02

See application file for complete search history.

(56) References Cited

U.S. PATENT DOCUMENTS

| | | | | |
|---|---|---|---|---|
| 5,873,112 A | * | 2/1999 | Norman | 711/103 |
| 6,285,627 B1 | * | 9/2001 | Kurihara et al. | 365/233.5 |
| 6,661,710 B1 | * | 12/2003 | Kwon | 365/185.24 |

FOREIGN PATENT DOCUMENTS

JP 2003-132681 5/2003

OTHER PUBLICATIONS

English language abstract of Japanese Publication No. 2003-132681.

* cited by examiner

*Primary Examiner*—Gene N. Auduong
(74) *Attorney, Agent, or Firm*—Marger Johnson & McCollom, P.C.

(57) ABSTRACT

A flash memory device includes a plurality of data pads to receive data from an adjacent plurality of data pins. A signal generation circuit generates a plurality of selection signals responsive to bit organization and package signals. A buffer circuit buffers the data from the plurality of data pads. An input switch receives the data from the buffer circuit and transmits the data to the data lines responsive to the selection signals. And an output switch provides data to the buffer circuit responsive to the selection signals.

20 Claims, 11 Drawing Sheets

SEMICONDUCTOR MEMORY DEVICE CAPABLE OF BEING MOUNTED ON A SINGLE PACKAGE REGARDLESS OF BIT ORGANIZATION

CROSS REFERENCE TO RELATED APPLICATIONS

This application claims priority from Korean Patent Application No. 2003-32347, filed on May 21, 2003, the contents of which are incorporated herein by reference in their entirety.

FIELD OF THE INVENTION

The present invention relates to a semiconductor memory device and, more particularly, to a semiconductor memory device capable of being mounted on a single package regardless of bit organization.

BACKGROUND OF THE INVENTION

Many electronic apparatus require memory devices that have high capacity and speed to process increased data volumes. The capacity of a memory device increases in proportion to advances in process technologies that allow for their gradual miniaturization. A demand exists, consequently, for a memory device that can maximize storage capacity on a limited area. Various efforts are underway to meet such a demand. One of these efforts involves storing N-bit data (N≧2), instead of 1-bit data, in a cell. Doing so allows fabrication of a memory device that has double or more integration density using the existing process technology. Another effort involves packing two or more integrated circuit chips (or dies) in a single package. Since a low capacity chip is small, a distance between a lead frame and a chip pad is sufficient to ensure appropriate wire bonding. But, since a high capacity chip is large, a distance between a lead frame and a chip pad is limited.

A data input/output speed of a semiconductor memory device varies with a bit organization. For example, comparing a device having an X8 bit organization and another having an X16 bit organization, both with the same capacity, the latter can achieve twice the data input/output speed of the former. Memory devices are constructed with either X8 or X16 bit organization according to the required application. But a typical wafer-level memory device is not. That is, the wafer-level device may alternately be constructed to support the X8 or X16 bit organizations. Once built, the memory device is at a pack-level selected to have X8 or X16 bit organization according to the required application. And the package must conform with the bit organization selected for the memory device.

Figure 1:
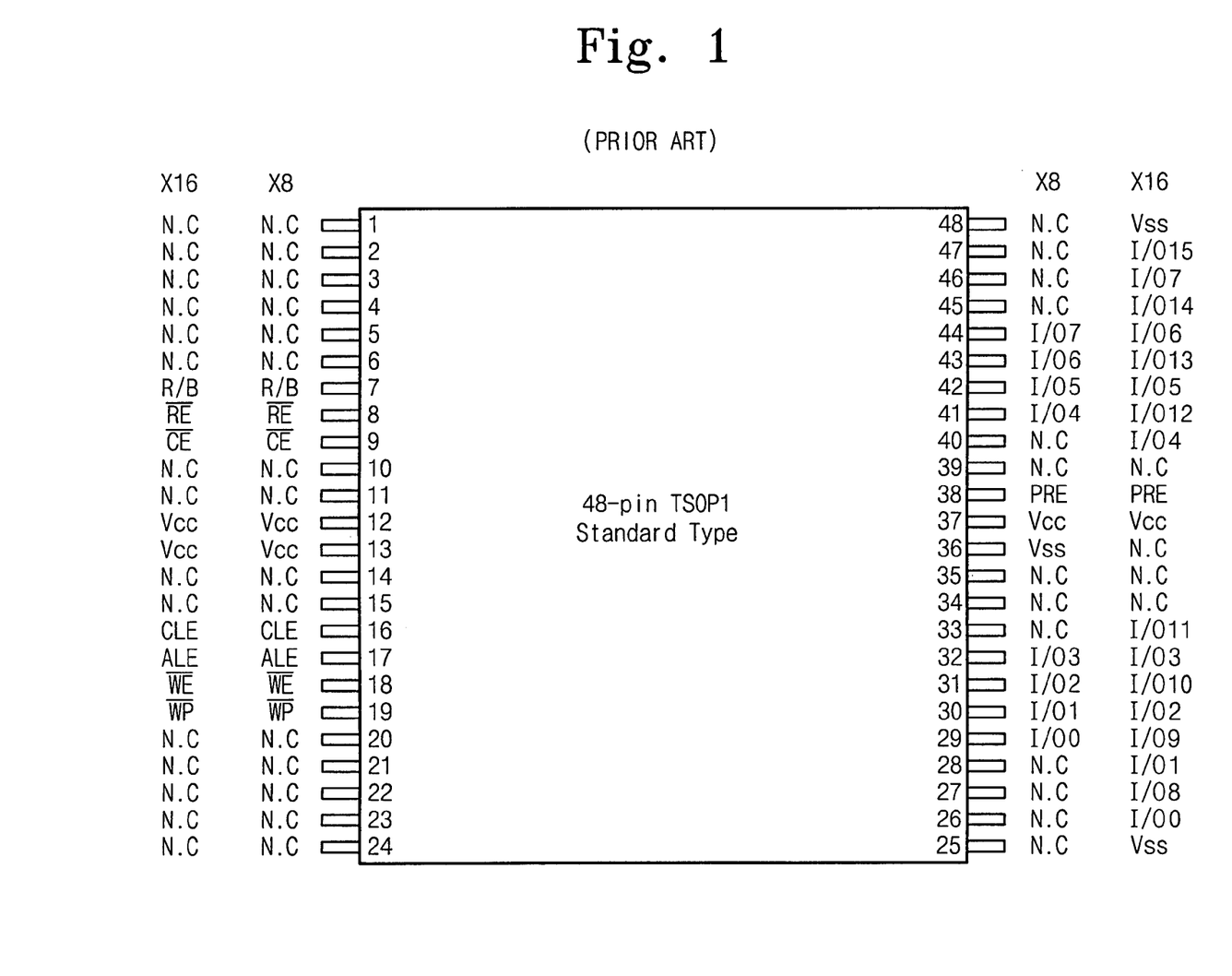
FIG. 1 is a package pin configuration that varies with bit organization.
Figure 2:
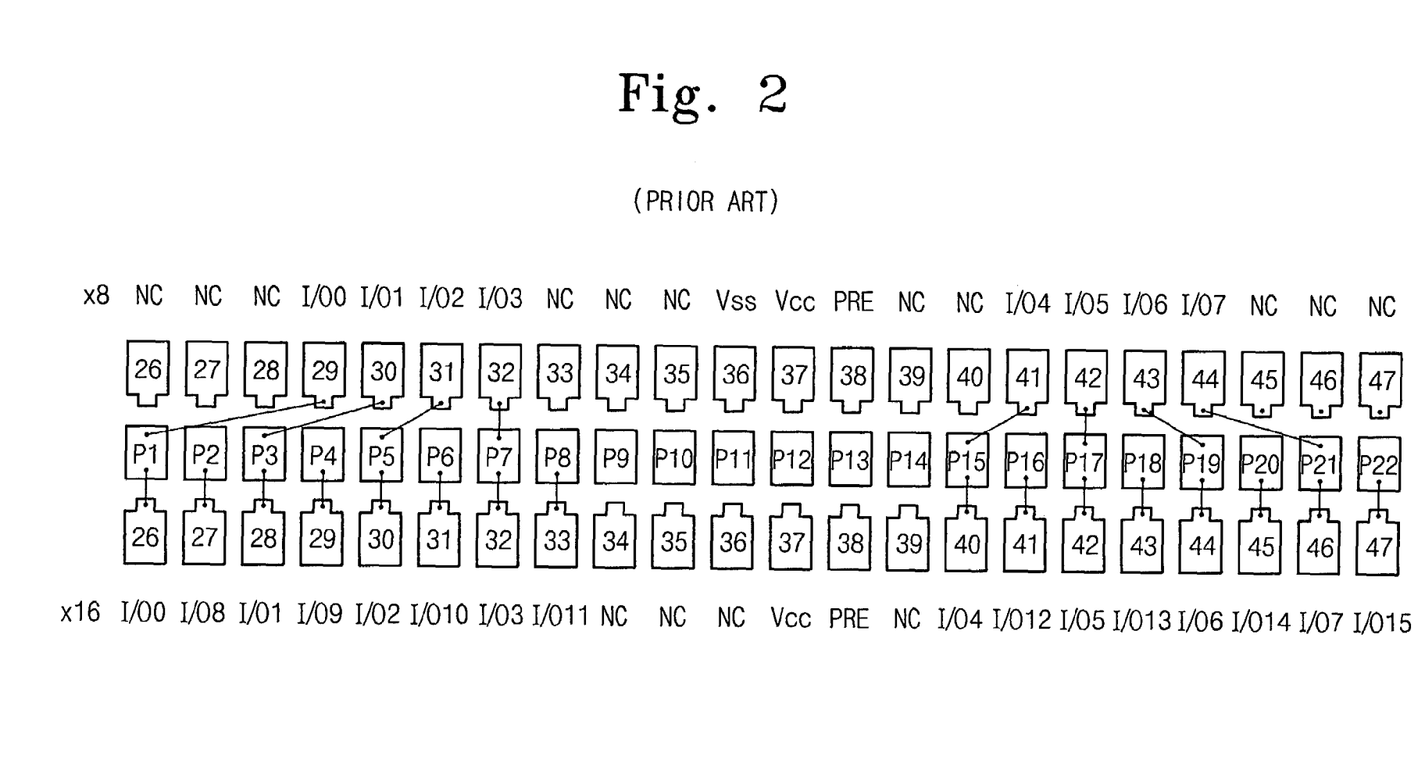
FIG. 2 is a connection relationship between data pads and data pins according to bit organization.

A package pin configuration is shown in FIG. 1. In a memory device having the X8 bit organization, data bits I/O0~I/O7 are input/output through data pins 29, 30, 31, 32, 41, 42, 43, and 44. In a memory device having the X16 bit organization, data bits I/O0–I/O15 are input/output through data pins 26, 27, 28, 29, 30, 31, 32, 33, 40, 41, 42, 43, 44, 45, 46, and 47. Since data bits are input/output through different pins according to a bit organization, data pads must be connected to different pins according to the bit organization. As shown in FIG. 2, in a case where a memory device has, for example, an X8 bit organization, data pins 29, 30, 31, 32, 41, 42, 43, and 44 must be electrically connected to corresponding data pads P1, P3, P5, P7, P15, P17, P19, and P21. In a case where the memory device has an X16 bit organization, data pins 26–33 and 40–47 must be electrically connected to corresponding data pads P1–P8 and P40–P47, respectively.

In the X16 bit organization, data pins must be electrically connected to adjacent data pads. In the X8 bit organization, data pins must be electrically connected to non-adjacent (or removed) data pins. This example assumes the memory device having the X8 and X16 bit organizations is packed using one package.

Since a low capacity chip is small in size, the distance between a lead frame of a package and a chip pad is sufficiently secured to perform a wire bonding. Conversely, since a high capacity chip is large in size, a distance between a lead from and a chip pad of a package is limited by package size. Thus, when a data pin (e.g., 29) is connected to a corresponding data pad (e.g., P1), the wire bonding can run over an adjacent data pad (e.g., P2). It may be necessary, therefore, to curve the wire bonding. Curved wire bonding, in turn, may lead to an unwanted connection to an unrelated data pad. This phenomenon more severely occurs in a mirror chip package.

A solution to the problem is to prepare alternate packages that correspond to the bit organizations or to prepare alternate data pad groups where one of the data pad groups includes data pads arranged for the X8 bit organization and the other includes data pads arranged for the X16 organization. But it is very burdensome to manage memory devices having different pad configurations and different packages having different bit organizations.

SUMMARY OF THE INVENTION

A feature of the invention is to overcome all the disadvantages associated with prior art devices including the disadvantages mentioned above.

Another feature of the present invention is to provide a semiconductor memory device capable of being mounted on a single package regardless of bit organization.

A flash memory device includes a plurality of data pads to receive data from an adjacent plurality of data pins. A signal generation circuit generates a plurality of selection signals responsive to bit organization and package signals. A buffer circuit buffers the data from the plurality of data pads. An input switch receives the data from the buffer circuit and transmits the data to the data lines responsive to the selection signals. And an output switch provides data to the buffer circuit responsive to the selection signals.

The buffer circuit includes a plurality of input buffers connected to adjacent data pads.

Some of the input buffers operate regardless of the bit organization signal while other input buffers operate responsive to bit organization signal.

The signal generation circuit includes an option circuit to generate the bit organization and package signals and a decoder to generate the selection signals responsive to the bit organization and package signals.

The signal generation circuit includes either a bonding circuit or a fuse circuit.

The bit organization signal indicates either X8 or X16 bit organization.

The package signal indicates either a normal or a mirror configuration.

The input switch includes a plurality of first input switches to receive data from a first group of data lines through the buffer circuit and a plurality of second input switches to receive data from a second group of data lines through the buffer circuit.

Each first input switch is a corresponding first input multiplexer and each second input switch is a corresponding second input multiplexer.

The output switch includes a plurality of first output switches to provide data to the buffer circuit from a first group of data lines and a plurality of second output switches to provide data to the buffer circuit from a second group of data lines.

Each first output switch is a corresponding first output multiplexer and each second output switch is a corresponding second output multiplexer.

The buffer circuit includes a plurality of input buffers, a plurality of output buffers, and a control circuit to enable the plurality of input and output buffers.

Some of the output buffers operate regardless of the bit organization signal while other output buffers operate responsive to the bit organization signal.

DESCRIPTION OF THE PREFERRED EMBODIMENT

A semiconductor memory device according to the present invention supports various bit organizations, e.g., X8 and X16 bit organizations. Before shipment, the semiconductor memory device is categorized as having either an X8 or X16 bit organization. Since different bit organizations are required depending on the application, a semiconductor memory device is generally designed to support all required bit organizations resulting in enhanced productivity. Prior to packaging, the semiconductor memory is fixed with the X8 or X16 bit organization through fuse or bonding option circuitry. In an embodiment, adjacent data pads and data pins are electrically interconnected through a bonding wire irrespective of a bit organization and a package type. Different data bits are input/output through any data pad according to the bit organization. Although different data bits are input/output through a data pad according to the bit organization, the memory device transmits the data bit to an assigned data line/assigned data pin. The semiconductor memory device, therefore, need only be mounted on a single package regardless of a bit organization and package type.

Figure 3:
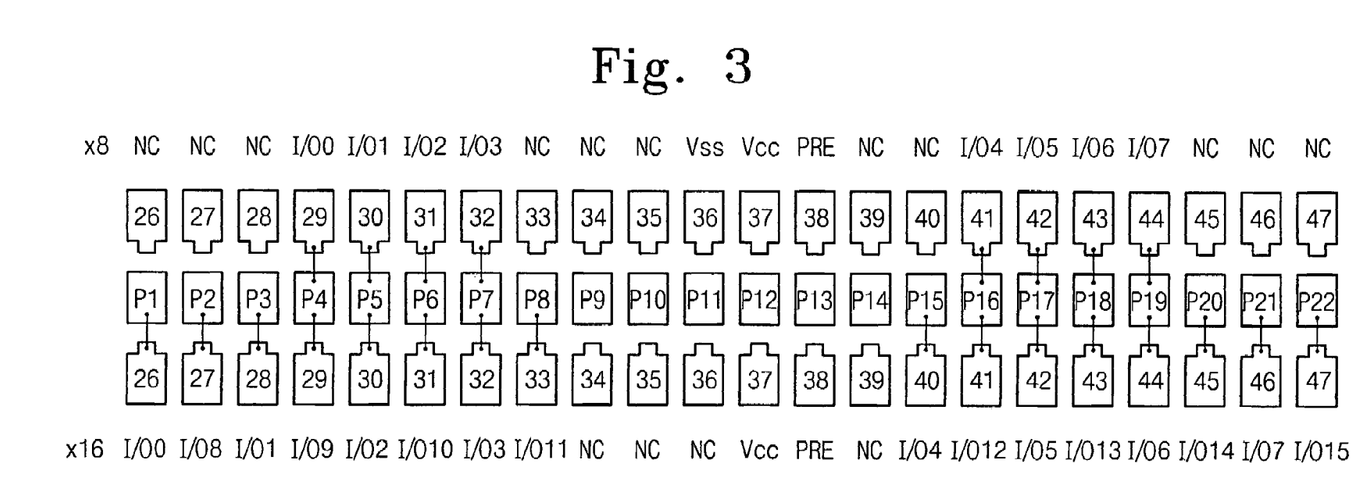
FIG. 3 is a connection relationship between data pads and data pins according to an embodiment of the present invention.

FIG. 3 is a connection relationship between data pads and data pins according to an embodiment of the present invention. Referring to FIG. 3, the semiconductor memory device includes a plurality of pads only partially illustrated. More particularly, the pads are illustrated centered on data pads to/from input/output data. Symbols "NC" mean that pins are not bonded to pads. The memory device is normally packed and its data pads are electrically connected to adjacent data pins through a bonding wire regardless of bit organization. In an X8 bit organization, data pads P4, P5, P6, P7, P16, P17, P18, and P19 are electrically connected to adjacent data pins 29, 30, 31, 32, 41, 42, 43, and 44 respectively. In a case where the memory device has, for example, an X16 bit organization, data pads P1–P8 and P15–P22 are electrically connected to adjacent data pins 26–33 and 40–47 respectively. That is, the inventive configuration allows for different data bits to be input/output to/from any data pad according to the bit organization. For example, since the data pad P4 is connected to the 29th pin regardless of bit organization, the data bit I/O0 is input/output through the data pad P4 in the X8 bit organization and a data bit I/O9 is input/output through the data pad P4 in the X16 bit organization. Since the data pad P1 is connected to the 26th pin only in the X16 bit organization, the data bit I/O0 is input/output through the data pad P1 in the X16 bit organization. Since the data pad P16 is connected to the 41st pin irrespective of the bit organization, a data bit I/O4 is input/output through the data pad P16 in the X8 bit organization and a data bit I/O12 is input/output through the data pad P16 in the X16 bit organization. Since the data pad P15 is connected to the 40th pin in the X16 bit organization, the data bit I/O4 is input/output through the data pad P15 only in the X16 bit organization.

Since data values assigned to different data lines are input/output through one data pad according to a bit organization, a data bit input to a data pad must be transmitted to an originally assigned data line. This is accomplished through an interface circuit of the semiconductor memory device that is explained below. Although bit organizations of a semiconductor memory device are different from each other, data pads of the memory device are electrically connected to adjacent data pins and the memory device use the same package.

Figure 4:
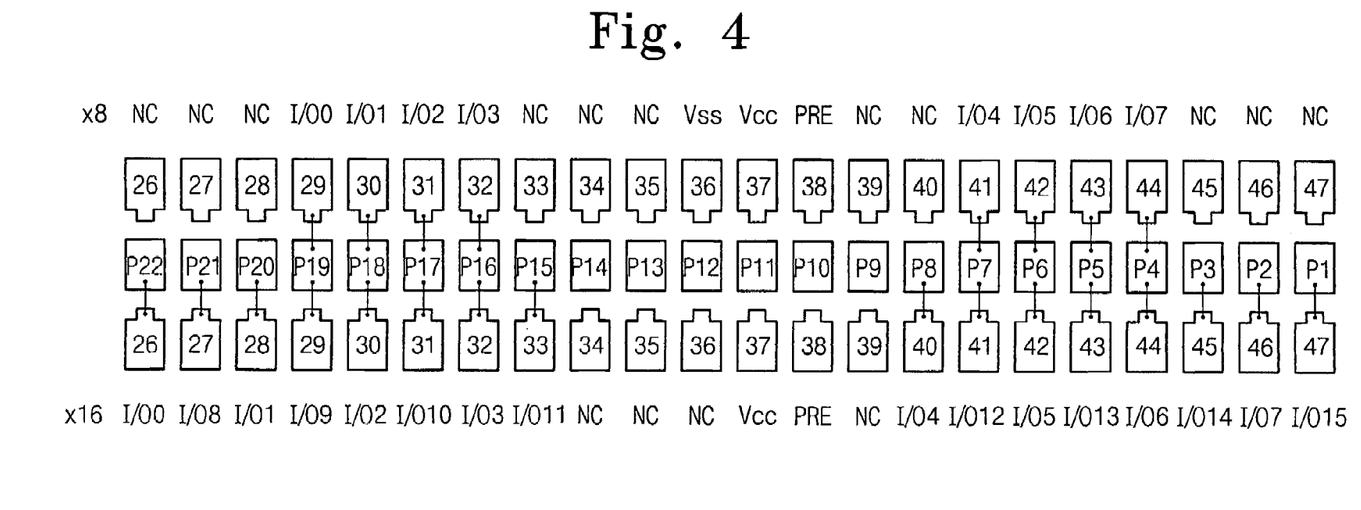
FIG. 4 is a connection relationship between data pads and data pins according to an embodiment of the present invention.

FIG. 4 is a connection relationship between data pads and data pins according to an embodiment of the present invention. The device in FIG. 4 is packed in a mirror configuration. Referring to FIG. 4, the semiconductor memory device includes a plurality of pads only partially illustrated. More particularly, the pads are illustrated centered on data pads to which data is input/output. Symbols "NC" mean that pins are not bonded to pads. As compared to the memory device shown in FIG. 3, data pads P22–P1 are inversely arranged and package pins are arranged as shown in FIG. 3. Regardless of bit organization, the data pads P22–P1 are electrically connected to adjacent data pins through a bonding wire. Where the device has an X8 bit organization, data pads P19, P18, P17, P16, P7, P6, P5, and P4 are electrically connected to adjacent pads pins 29, 30, 31, 32, 41, 42, 43, and 44, respectively. Where the device has an X16 bit organization, data pads P22–P15 and P8–P1 are electrically connected to adjacent data pins 26–33 and 40–47, respectively. Different data bits are, therefore, input/output to/from any data pad according to bit organization. For example, a data bit I/O0 is input through the data pad P19 in the X8 bit organization. Since the data pad P22 is connected to the 26th pin in the X16 bit organization, a data bit I/O0 is input/output through the data pad P22 in the X16 bit organization. Since the data pad P7 is connected to the 41st pin irrespective of the bit organization, a data bit I/O4 is input/output through the data pad P7 in the X8 bit organization and a data bit I/O12 is input/output through the data pad P7. Since the data pad P8 is connected to the 40th pin only in the X16 but organization, the data bit I/O4 is input/output through the data pad P8.

Since data values assigned to different data lines are input/output through one data pad according to bit organization, a data bit input to a data pad must be transmitted to an originally assigned data line. This is accomplished by an inventive interface circuit explained in detail below. Although the semiconductor memory device bit organizations differ, data pads of the memory device are electrically connected to adjacent data pins and the memory device may be packed using the same package.

Figure 5:
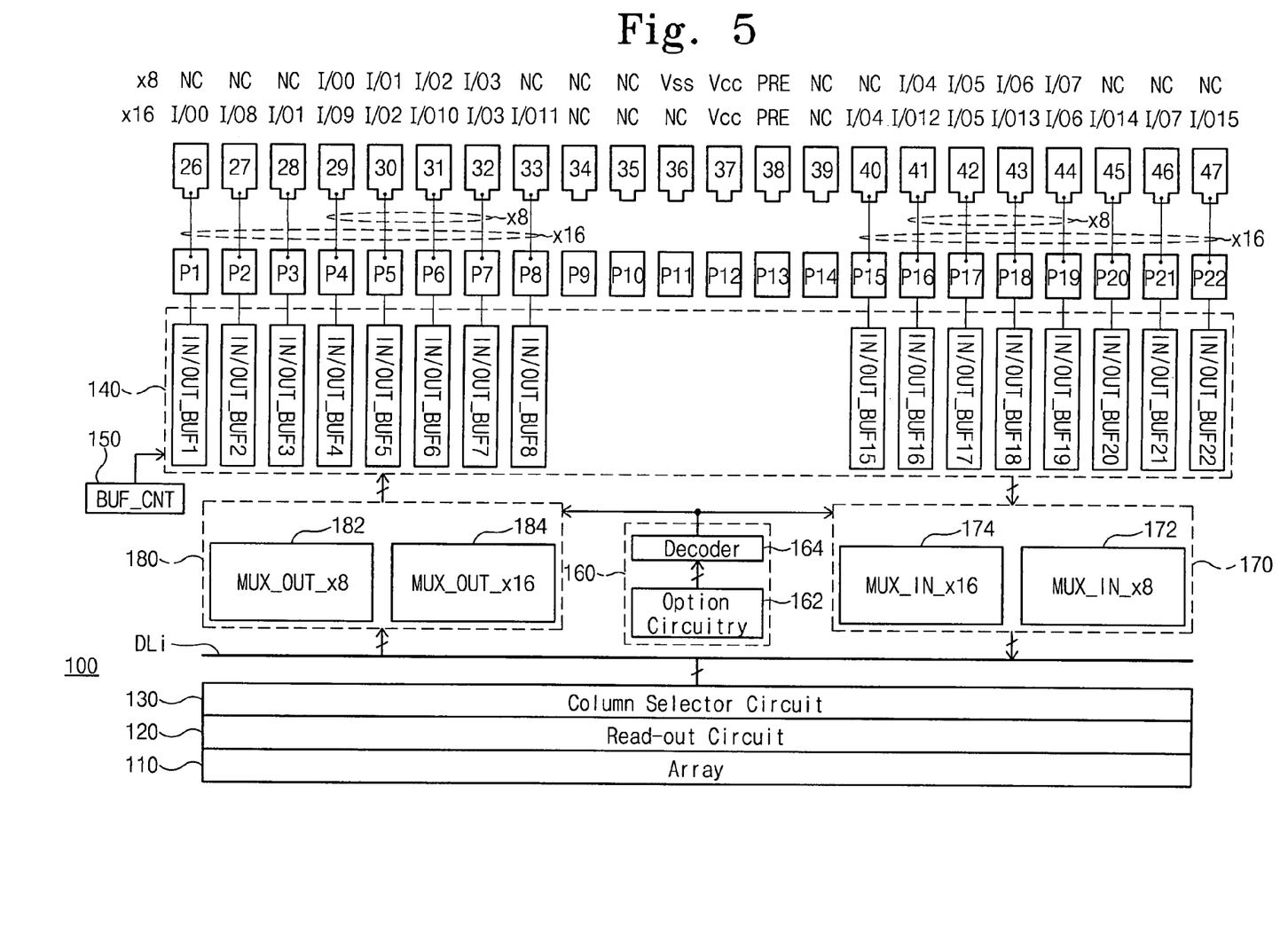
FIG. 5 is a block diagram of an embodiment of a semiconductor memory device according to the present invention.

FIG. 5 is a block diagram of an embodiment of a semiconductor memory device according to the present invention. Referring to FIG. 5, the memory device 100 includes a memory cell array 110 for storing data. The array 110 comprises plural memory cells organized in rows and columns. A read-out circuit 120 reads data from the array 110. The read data is transferred to data lines DLi (i=16 in this embodiment) through a column selector circuit 130. The read circuit 120 additionally latches data from the data lines Dli and stores the latched data in the memory cell array 110. When the memory device 100 operates with X8 bit organization, the column selector circuit 130 transfers 8-bit data to the data lines DL0–DL7. When the memory device 100 operates with X16 bit organization, the column selector circuit 130 transfers 16-bit data to the data lines DL0–DL15. Put differently, the data lines DL8–DL15 are not used in the X8 bit organization.

Figure 6:
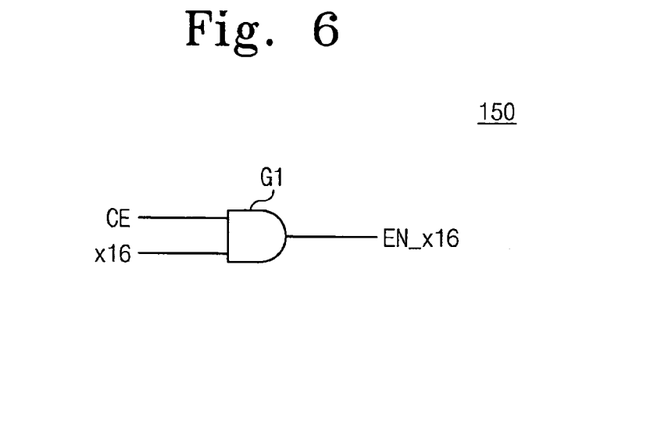
FIG. 6 is a circuit diagram of an embodiment of a buffer control circuit shown in FIG. 5.
Figure 7:
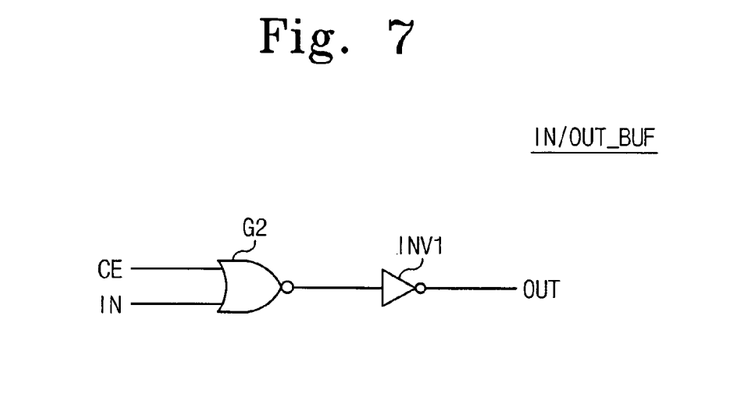
FIG. 7 is a circuit diagram of an embodiment of input buffers as shown in FIG. 5 and as used in an X8 bit organization.
Figure 8:
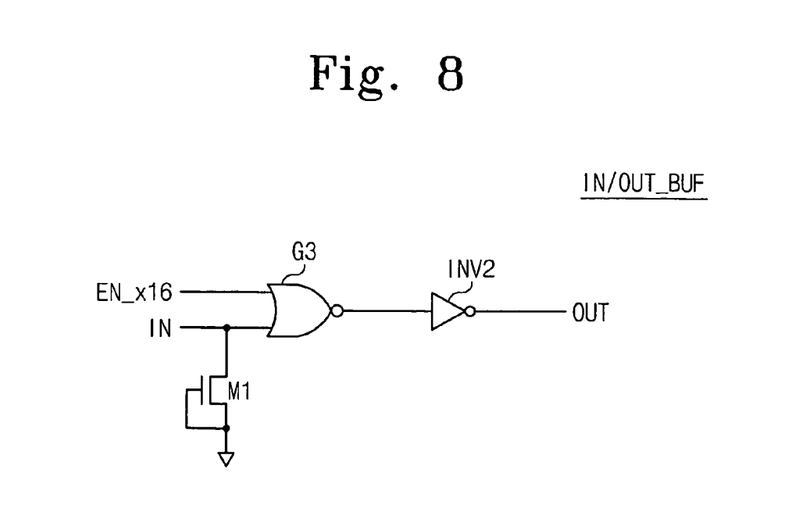
FIG. 8 is a circuit diagram of an embodiment of input buffers as shown in FIG. 5 and as used in an X16 bit organization.

As shown in FIG. 5, the semiconductor memory device 100 includes a plurality of pads P1–P22. In an embodiment, the pads P1–P8 and P15–P22 may be data pads for inputting/outputting data whereas the pads P9–P14 may not be data pads. The data pads P1–P8 and P15–P22 are connected to the input/output buffer circuit 140. The input/output buffer circuit 140 includes input/output buffers IN/OUT$_{13}$BUF1–IN/OUT_BUF8 and IN/OUT_BUF15–IN/OUT_BUF22 that are coupled to the data pads P1–P8 and P15–P22, respectively. Some of the input/output buffers IN/OUT_BUF0–IN/OUT_BUF15 operate regardless of bit organization while others operate selectively according to bit organization. For example, the input/output buffers coupled to the data pads P4–P7 and P16–P19 always operate in an X16 bit organization. A circuit diagram showing one of the input/output buffers respectively coupled to the data pads P4–P7 and P16–P19 is shown in FIG. 8. Input/output buffers connected to data pads P1–P3, P8, P15, and P20–P22 are controlled by a buffer control circuit (BUF_CNT) 150. The buffer control circuit 150 includes an AND gate G1 for receiving a flag signal X16 and a chip enable signal CE, as shown in FIG. 6. Input/output buffers IN/OUT_BUF1–IN/OUT_BUF3, IN/OUT_BUF8, IN/OUT_BUF15, and IN/OUT_BUF20–IN/OUT/BUF22 connected to the data pads P1–P3, P8, P15, and P20–P22, respectively, operate when an output signal EN_X16 generated by the buffer control circuit 150 is activated. Conversely, the IN/OUT_BUF1–IN/OUT_BUF3, IN/OUT_BUF8, IN/OUT_BUF15, and IN/OUT_BUF20–IN/OUT_BUF22 are disabled when the output signal EN_X16 is inactive.

Figure 9:
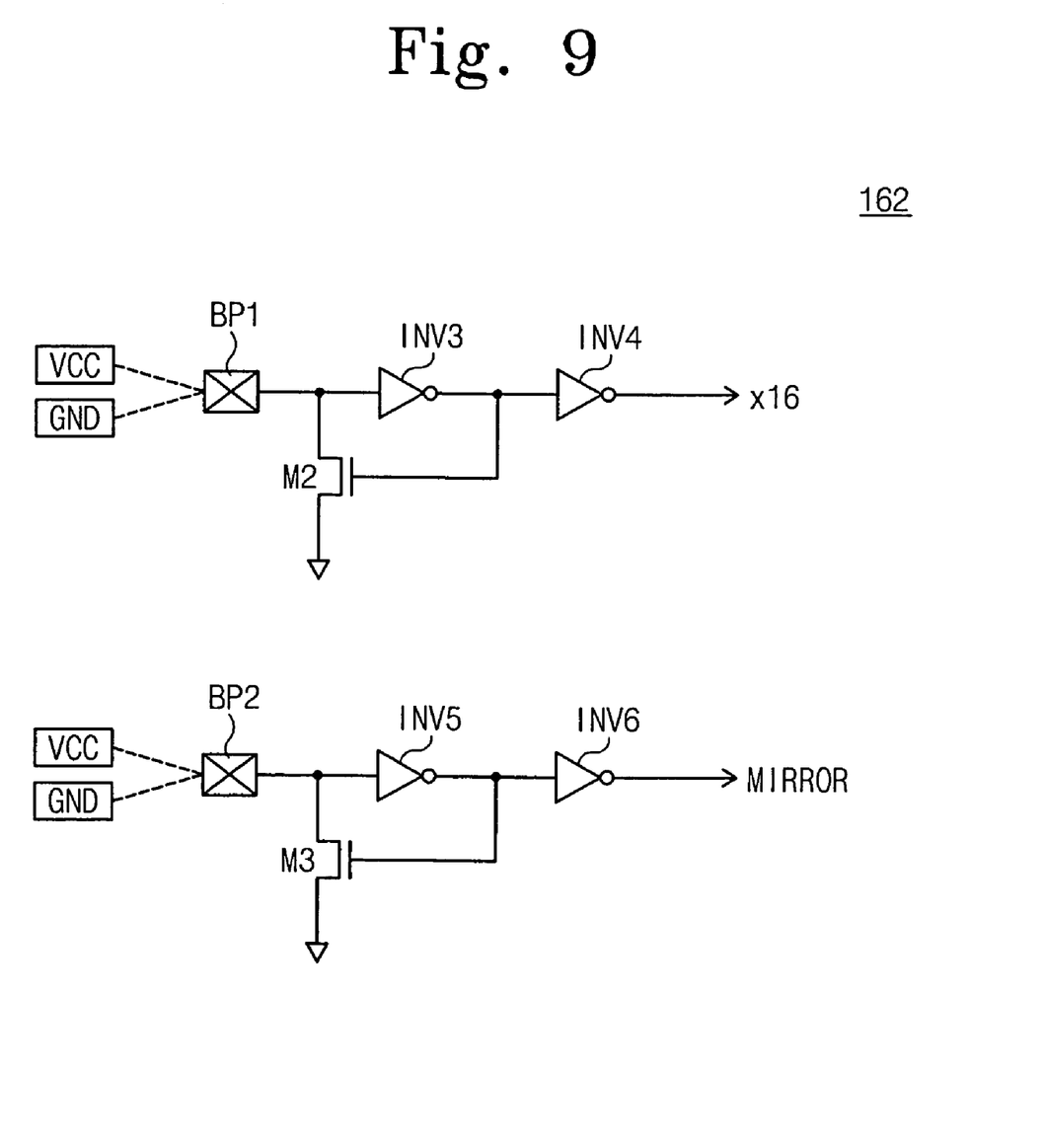
FIG. 9 is a circuit diagram an embodiment of the option circuit shown in FIG. 5.
Figure 10:
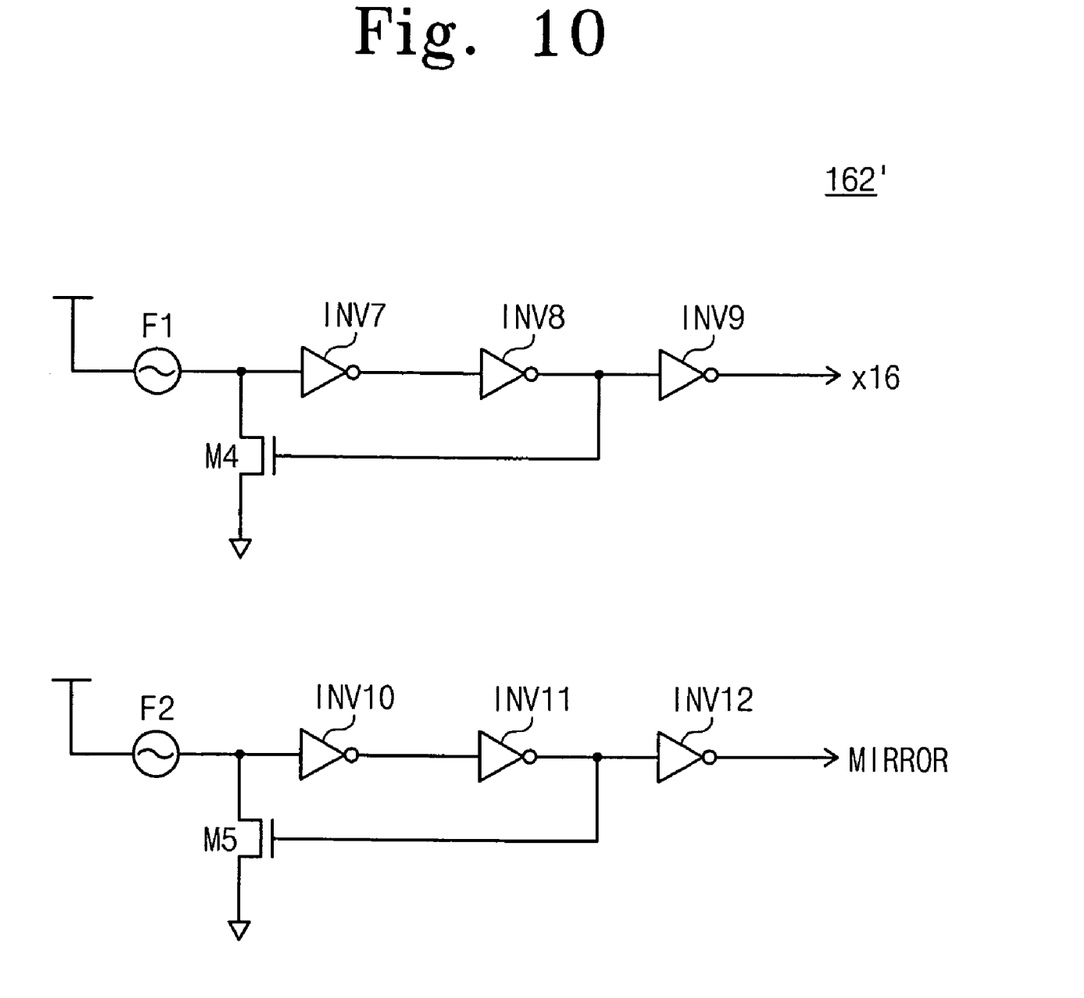
FIG. 10 is a circuit diagram of an embodiment of the option circuit shown in FIG. 5.

As shown in FIG. 5, the semiconductor memory device 100 further includes a switch control block 160. The switch control block 160 includes an option circuit 162 and a decoder circuit 164. The option circuit 162 includes pads BP1 and BP2, inverters INV3, IN/V4, INV5, and INV6, and NMOS transistors M2 and M3, as shown in FIG. 9. Each of the pads BP1 and BP2 is connected to a power supply voltage or a ground voltage through a bonding wire. Depending on whether the pads BP1 and BP2 are connected to the power supply voltage, logic levels of the flag signals X16 and MIRROR are determined. The flag signal MIRROR indicates whether the memory device is configured in a mirror shape. Instead of the bonding pad of FIG. 9, the option circuit 162 may be made of a fuse, as shown in FIG. 10. The logic levels of flag signals X16 and MIRROR are as shown in Table 1.

TABLE 1

| BP2 | BP1 | X16 | MIRROR |
|---|---|---|---|
| GND | GND | L | L |
| GND | VCC | H | L |
| VCC | GND | L | H |
| VCC | VCC | H | H |

The semiconductor memory device 100 operates in an X8 bit organization when the flag signal X16 has a low level. The device 100 operates in an X16 bit organization when the flag signal X16 has a high level. The semiconductor memory device 100 is normally packed when the flag signal MIRROR has a low level. The device 100 is configured in a mirror shape when the flag signal MIRROR has a high level.

Figure 11:
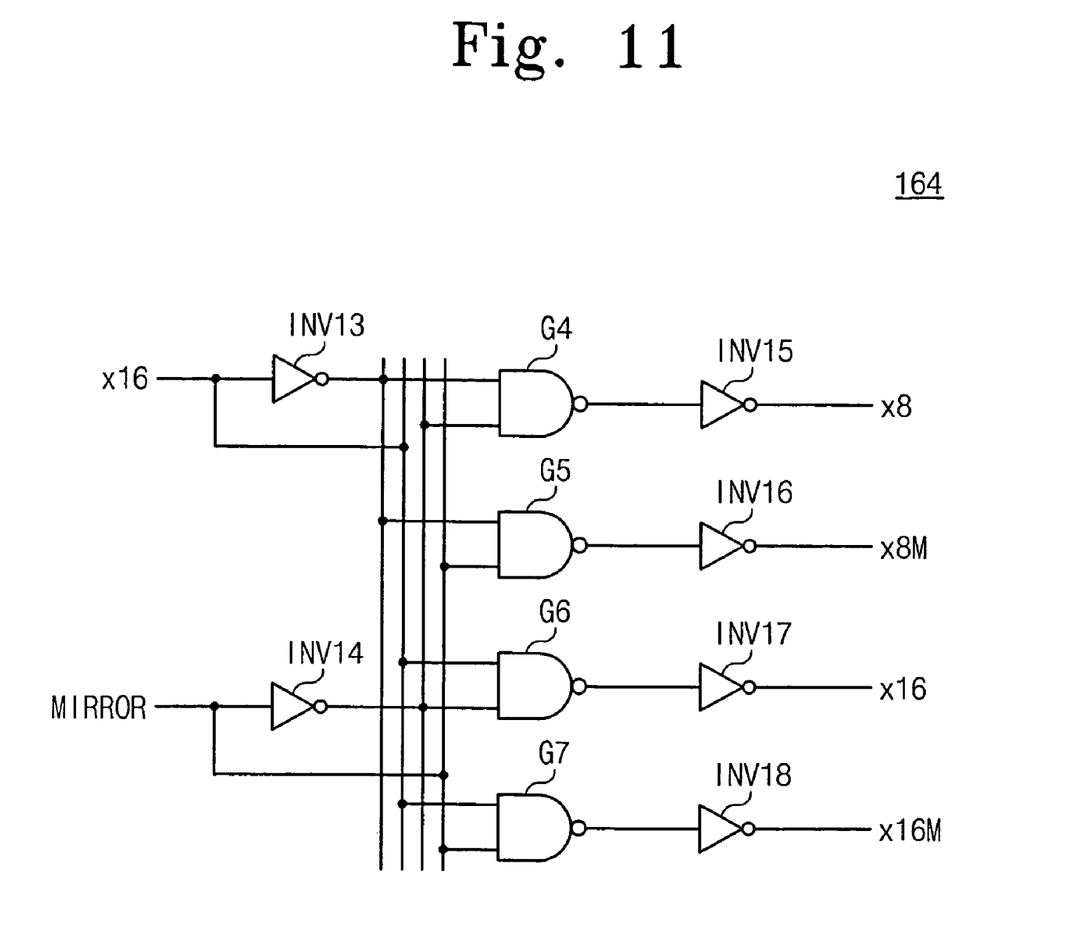
FIG. 11 is a circuit diagram of an embodiment of a decoder circuit shown in FIG.

The decoder circuit 164 decodes the flag signals X16 and MIRROR to generate selection signals X8, X8M, X16, and X16M. One of the selection signals X8, X8M, X16, and X16M is active high, while the others are inactive low. For example, the selection signal X8 is activated when the semiconductor memory device 100 operates in the X8 bit organization and is normally packed. The selection signal X8M is active when the semiconductor memory device 100 operates in the X8 bit organization and is packed in the mirror configuration. The selection signal X16 is active when the semiconductor device 100 operates in the X16 bit organization and is normally packed. The selection signal X16M is active when the semiconductor memory device 100 operates in the X16 bit organization and is packed in the mirror configuration. In an embodiment, the decoder circuit 164 includes inverters INV13–INV18 and NAND gates G4–G7, as shown in FIG. 11.

Returning to FIG. 5, the semiconductor memory device 100 further includes an input switch block 170 and an output switch block 180. The input switch block 170 operates responsive to the switch control block 160. The switch block 170 selectively transmits outputs of the input/output buffer circuit 140 to the data lines DLi. The input switch block 170 includes a first input multiplexer circuit MUX_IN_X8 172 and a second input multiplexer circuit MUX_IN_X16 174. The first multiplexer circuit 172 transmits the outputs of the input/output buffer circuit 140 to the data lines DL0–DL7 regardless of bit organization. The second multiplexer circuit 174 transmits the outputs of the input/output buffer circuit 140 to the data lines DL8–DL15 in the X16 bit organization. The output switch block 180 operates responsive to the switch control block 160 and selectively transmits signals on the data line DLi to the input/output buffer circuit 140. The output switch block 180 includes a first output multiplexer circuit MUX_OUT_X8 182 and a second output multiplexer circuit 184 MUX_OUT_X16. The first output multiplexer circuit 182 transmits signals on he data lines DL0–DL7 to the input/output buffer circuit 140 regardless of bit organization. The second output multiplexer circuit 184 transmits signals on the data lines DL8–DL15 to the input/output buffer 140 in the X16 bit organization. The input and output switch circuits 170 and 180 are explained in detail below.

Figure 12:
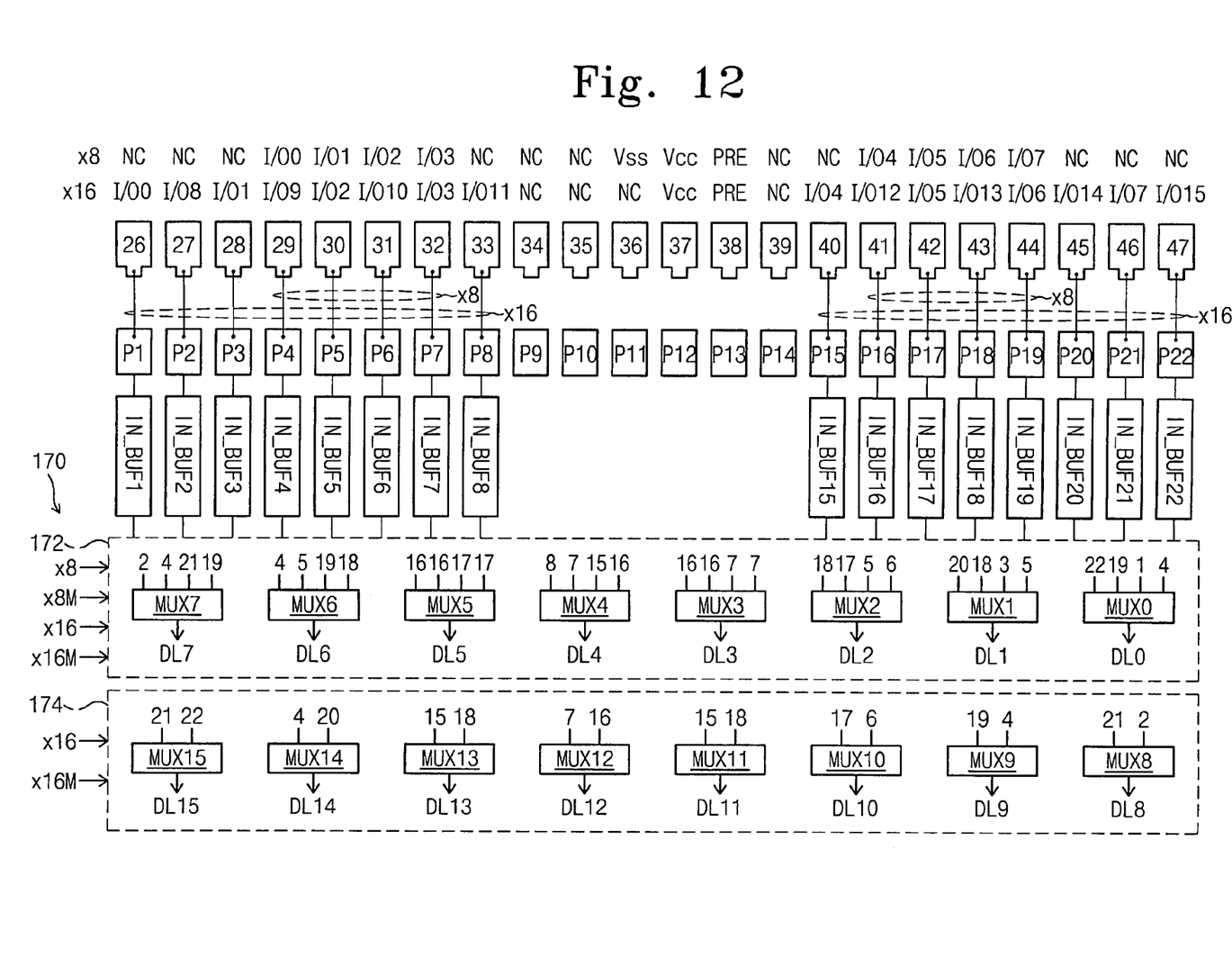
FIG. 12 is a block diagram of an embodiment of an input switch block shown in FIG. 5.

FIG. 12 is a block diagram of an embodiment of the input switch block 170 shown in FIG. 5. Data pins are connected to corresponding data pads on the basis of the X16 bit organization. In case of the X8 bit organization, data pins 26–28, 33, 40, and 45–47 are NC pins. As can be seen in FIG. 12, data pads are electrically connected to adjacent data pins regardless of bit organization. Data pads P1–P8 and P15–P22 are connected to corresponding input buffers IN_BUF1–IN_BUF8 and IN_BUF15–IN_BUF22, respectively. Input buffers IN_BUF0–IN_BUF8 and IN_BUF15–IN_BUF22 are connected to corresponding pads P1–P8 and P15–P22, respectively.

The first input multiplexer circuit 172 includes eight multiplexers MUX0–MUX7 and operates responsive to selection signals X8, X8M, X16, and X16M from the control switch circuit 160. The multiplexer MUX0 transfers an externally input data bit I/O0 to an assigned data line DL0. The multiplexer MUX0 receives outputs of input buffers IN_BUF1, IN_BUF4, IN_BUF19, and IN_BUF22 connected to data pads P1, P4, P19, and P22, respectively. The MUX0 selects one of input signals responsive to the selection signals X8, X8M, X16, and X16M. The selected signal is transferred to the data line DL0. Where a memory device 100 is normally packed, the data bit I/O0 is input through the data pad P4 connected to the 29th pin in the X8 bit organization and is input through the data pad P1 connected to the 26th pin in the X16 bit organization. Where the memory device 100 is mirror packed, the data bit I/O0 is input through the data pad P19 connected to the 29th pin in the X8 bit organization and is input through the data pad P22 connected to the 26th pin in the X16 bit organization, as shown in FIG. 4. Therefore, the outputs of the input buffers respectively connected to the data pads P1, P4, P19, and P22 are provided to the multiplexer MUX0. Inputs of the other multiplexers MUX1–MUX7 are determined similarly, and will not be explained in any further detail.

Figure 13:
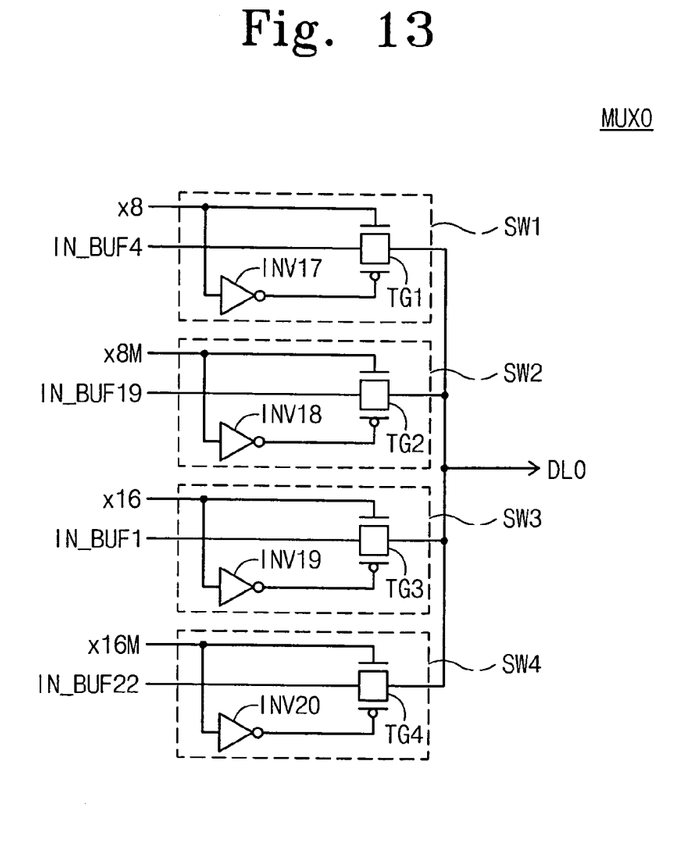
FIG. 13 is a circuit diagram of an embodiment of a multiplexer (MUX0) of a first input multiplexer block shown in FIG. 12.

Referring to FIG. 13 showing one of the multiplexers MUX0–MUX7, the multiplexer MUX0 includes a switch comprising an inverter and a transmission gate. The other multiplexers MUX1–MUX7 have a similar structure. As previously stated, since only one of the selection signals X8, X8M, X16, and X16M is active high, only one of input signals is transmitted to a corresponding data line.

The second input multiplexer circuit 174 includes eight multiplexers MUX8–MUX15. The circuit 174 operates responsive to the selection signals X16 and X16M from the switch control circuit 160. The multiplexer MUX8 transmits an externally input data bit I/O8 to an assigned data line DL8. The multiplexer MUX8 receives outputs of input buffers respectively connected to the data pads P2 and P21 and selects one of input signals responsive to the selection signals X16 and X16M. The selected signal is transmitted to the data line DL8. Where the memory device 100 is normally packed, the data bit I/O8 is input through the data pad P21 connected to a 27th pin. Where the memory device 100 is mirror packed, the data bit I/O8 is input through the data pad P21 connected to the 27th pin, as shown in FIG. 4. Therefore, outputs of the input buffers respectively connected to the data pads P2 and P21 are provided to the multiplexer MUX8. Inputs of the other multiplexers MUX9–MUX15 are determined similarly, and will not be explained in any further detail.

Figure 14:
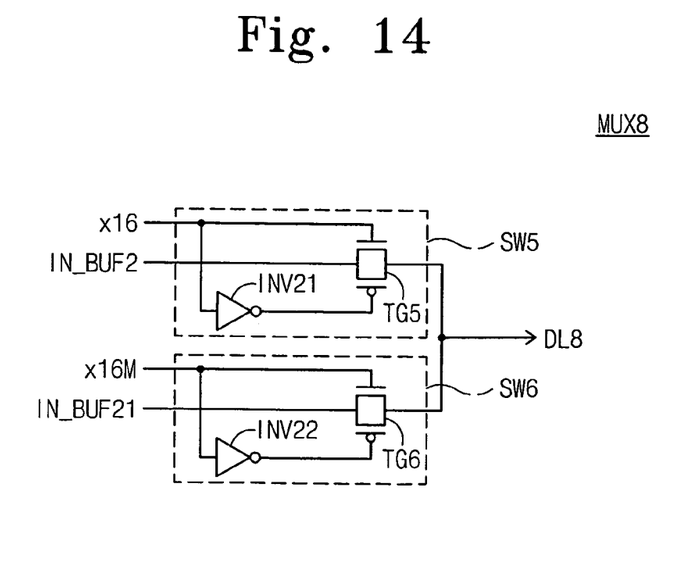
FIG. 14 is a circuit diagram of an embodiment of a multiplexer (MUX8) of the first input multiplexer block shown in FIG. 12.

FIG. 14 is a circuit diagram of an embodiment of one of the multiplexers MUX8–MUX15. Referring to FIG. 14, the multiplexer MUX8 includes a switch comprising an inverter and a transmission gate. The other multiplexers MUX9–MUX15 have a similar structure. Since only one of the selection signals X16 and X16M is active high, only one of the input signals is transmitted to a corresponding data line.

Figure 15:
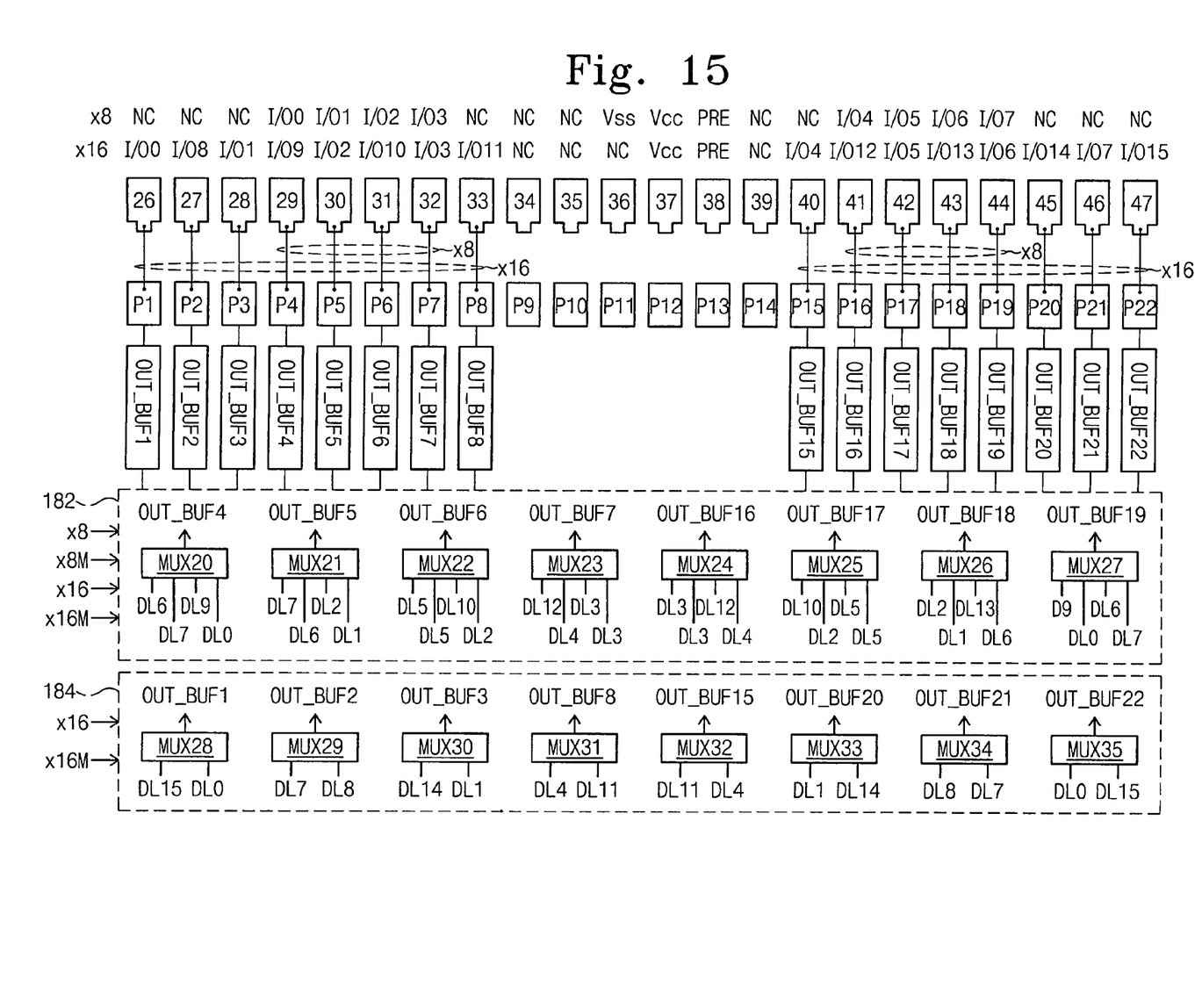
FIG. 15 is a block diagram of an embodiment of an output switch block shown in FIG. 5.

FIG. 15 is a block diagram of an embodiment of the output switch block 180 shown in FIG. 5. Referring to FIG. 15, data pins are connected to corresponding data pads on the basis of the X16 bit organization. Where the device 100 has the X8 bit organization, data pins 26–28, 33, 40, and 45–47 are NC pins. As can be seen in FIG. 13, the data pads are electrically connected to adjacent data pins regardless of bit organization. The data pads P1–P8 and P15–P22 are connected to output buffers OUT_BUF1–OUT_BUF8 and OUT_BUF15–OUT_BUF22, respectively.

The first output multiplexer circuit 182 includes eight multiplexers MUX20–MUX27. The circuit 182 operates responsive to the selection signals X8, X8M, X16, and X16M from the switch control circuit 160. The multiplexer MUX20 is connected to the output buffer OUT_BUF4. The multiplexer MUX20 receives one of signals on data lines in response to the selection signals X8, X8M, X16, and X16M. The selected signal is transmitted to the output buffer OUT_BUF4. Where the memory device 100 is normally packed, the data pad P4 outputs a data bit I/O0 in the X8 bit organization and outputs a data bit I/O9 in the X16 bit organization. Where the memory device 100 is mirror packed, the data pads output a data bit I/O7 in the X8 bit organization and output a data bit I/O6 in the X16 bit organization, as shown in FIG. 4. Therefore, signals on data lines DL0, DL6, DL7, and DL9 are input to the multiplexer MUX20.

Inputs of the other multiplexers MUX21–MUX27 are determined similarly and will not be described in any further detail. The multiplexer in the first multiplexer circuit 182 have a similar construction as shown in FIG. 13 and will not be described in any further detail.

The second output multiplexer circuit 184 includes eight multiplexers MUX28–MUX35. The circuit 184 operates responsive to the selection signals X16 and X16M from the switch control circuit 160. The multiplexer MUX28 is connected to the output buffer OUT_BUF1. The multiplexer MUX28 receives signals on the data lines DL0 and DL15 and selects one of input signals responsive to the selection signals X16 and X16M. The selected signal is transmitted to the output buffer OUT_BUF1. The output buffer OUT_BUF1 is connected to the data pad P1. Where the memory device 100 is mirror packed, the data pad outputs a data bit I/O15 in the X16 bit organization, as shown in FIG. 4. Therefore, the signals on the data lines DL0 and DL15 are input to the multiplexer MUX28.

Inputs of the other multiplexers MUX29–MUX35 are determined similarly and will not be described in any further detail. The multiplexers in the second output multiplexers 184 have a similar construction and will not be described in any further detail.

As previously stated, adjacent data pins and data pads are electrically interconnected regardless of package shape and bit organization. Therefore, it is possible to prevent electrical shorts relating to bonding wires. A semiconductor memory device having the above structure may be fixed with an X8 bit organization, an X16 bit organization, or any other organization. Although the memory device may have any bit organization, it is packed using the same package. Since the memory device may have X8 or X16 bit organizations, different data bits are input/output through the same data pad. For example, a data bit of I/O0 or I/O9 is input/output through a data pad P9. An option circuit is programmed to transmit data bits to originally assigned data pins/data lines through an input switch block/output switch block.

While the present invention has been particularly shown and described with reference to X8 and X16 bit organizations, it will be understood by those skilled in the art that various changes in form and detail may be made without departing from the spirit and scope of the invention as recited in the claims.

We claim:

1. A flash memory device comprising:
   a plurality of adjacent data pads to receive data from plurality of adjacent data pins;
   a signal generation circuit to generate a plurality of bit organization selection signals responsive to bit organization and package signals;
   a buffer circuit to buffer the data from the plurality of adjacent data pads;
   an input switch to receive the data from the buffer circuit and to transmit the data to the data lines responsive to the selection signals; and
   an output switch to provide data to the buffer circuit responsive to the bit organization selection signals.

2. The flash memory device of claim 1 where the buffer circuit includes a plurality of input buffers connected to adjacent data pads.

3. The flash memory device of claim 2
   where some input buffers operate regardless of the bit organization signal; and
   where other input buffers operate responsive to the bit organization signal.

4. The flash memory device of claim 2 where the signal generation circuit includes:
   an option circuit to generate the bit organization signals; and
   a decoder to generate the selection signals responsive to the bit organization and package signals.

5. The flash memory device of claim 1 where the signal generation circuit includes one of a bonding circuit and a fuse circuit.

6. The flash memory device of claim 1
   where the bit organization signal indicates one of an X8 and an X16 bit organization.

7. The flash memory device of claim 1 where the input switch includes:
   a plurality of first input switches to receive data from the buffer circuit and to transmit the received data through a first group of data lines; and
   a plurality of second input switches to receive data from the buffer circuit and to transmit the received data to a second group of data lines.

8. The flash memory device of claim 7
   where each first input switch is a corresponding first input multiplexer; and
   where each second input switch is a corresponding second input multiplexer.

9. The flash memory device of claim 1 where the output switch includes:
   a plurality of first output switches to provide data to the buffer circuit from a first group of data lines; and
   a plurality of second output switches to provide data to the buffer circuit from a second group of data lines.

10. The flash memory device of claim 9
    where each first output switch is a corresponding first output multiplexer; and
    where each second output switch is a corresponding second output multiplexer.

11. The flash memory device of claim 2 where the buffer circuit includes:
    a plurality of input buffers;
    a plurality of output buffers; and
    a control circuit to enable the plurality of input and output buffers.

12. The flash memory device of claim 11
    where some output buffers operate regardless of the bit organization signal; and
    where other output buffers operate responsive to the bit organization signal.

13. A NAND-type flash memory device comprising:
    a memory cell array to store data;
    a plurality of adjacent data pads electrically coupled to adjacent data pins;
    a plurality of input buffers electrically coupled to an adjacent plurality of data pads;
    a plurality of output buffers electrically coupled to the adjacent plurality of data pads;
    a signal generation circuit to generate selection signals according to bit organization and package signals;
    an input switch to transmit data from the data pads to a plurality of data lines responsive to the selection signals; and
    an output switch to transmit data from the plurality of data lines to the output buffers responsive to the selection signals.

14. The NAND-type flash memory device of claim 13
    where some input buffers operate regardless of the bit organization signal; and
    where other input buffers operate according to the bit organization signal.

15. The NAND-type flash memory device of claim 13
    where some output buffers operate regardless of the bit organization signal; and
    where other output buffers operate according to the bit organization signal.

16. The NAND-type flash memory device of claim 13 where the signal generation circuit includes a bonding circuit.

17. The NAND-type flash memory device of claim 13 where the signal generation circuit includes a fuse circuit.

18. The NAND-type flash memory device of claim 13 where the bit organization signal indicates one of an X8 organization and an X16 organization.

19. The NAND-type flash memory device of claim 13 where the package signal indicates a minor configuration.

20. The NAND-type flash memory device of claim 13
    where the input switch includes a plurality of input multiplexers that operate responsive to the selection signals; and
    where the output switch includes a plurality of output multiplexers that operate responsive to the selection signals.

* * * * *

UNITED STATES PATENT AND TRADEMARK OFFICE
CERTIFICATE OF CORRECTION

PATENT NO. : 7,120,056 B2
APPLICATION NO. : 10/848694
DATED : October 10, 2006
INVENTOR(S) : Soon-Young Kim et al.

It is certified that error appears in the above-identified patent and that said Letters Patent is hereby corrected as shown below:

Column 5, line 54, the word "IN/OUT$_{13}$BUF1" should read -- IN/OUT_BUF1 --;

Column 9, line 47, the words "and package signals." should read -- signals. --.

Signed and Sealed this

Eighteenth Day of August, 2009

David J. Kappos
*Director of the United States Patent and Trademark Office*